United States Patent
Song et al.

(10) Patent No.: US 10,914,007 B2
(45) Date of Patent: Feb. 9, 2021

(54) METHOD AND APPARATUS FOR SUBSTRATE PROCESSING

(71) Applicant: NPS Corporation, Hwaseong-Si (KR)

(72) Inventors: Dae Seok Song, Hwaseong-Si (KR); Hyun Jin Park, Suwon-Si (KR)

(73) Assignee: NPS Corporation

( * ) Notice: Subject to any disclaimer, the term of this patent is extended or adjusted under 35 U.S.C. 154(b) by 181 days.

(21) Appl. No.: 15/917,568

(22) Filed: Mar. 9, 2018

(65) Prior Publication Data

US 2018/0298495 A1    Oct. 18, 2018

(30) Foreign Application Priority Data

Apr. 13, 2017  (KR) .................. 10-2017-0047964

(51) Int. Cl.
| | |
|---|---|
| *C23C 16/48* | (2006.01) |
| *C23C 16/26* | (2006.01) |
| *C23C 16/46* | (2006.01) |
| *C23C 16/458* | (2006.01) |
| *H01L 21/687* | (2006.01) |
| *H01L 21/67* | (2006.01) |

(52) U.S. Cl.
CPC ............ *C23C 16/481* (2013.01); *C23C 16/26* (2013.01); *C23C 16/458* (2013.01); *C23C 16/46* (2013.01); *H01L 21/67115* (2013.01); *H01L 21/6875* (2013.01); *H01L 21/68764* (2013.01); *H01L 21/68785* (2013.01)

(58) Field of Classification Search
CPC ........... H01L 21/67115; H01L 21/6875; H01L 21/68764; H01L 21/68785; H01L 21/677; C23C 16/481; C23C 16/26; C23C 16/458; C23C 16/46

USPC ............. 219/385, 444.1, 411; 392/416–419; 118/719, 722, 724, 725, 620, 641
See application file for complete search history.

(56) References Cited

U.S. PATENT DOCUMENTS

| | | | |
|---|---|---|---|
| 3,554,512 A * | 1/1971 | Elliott ................... | C23C 14/243 432/233 |
| 6,414,280 B1 * | 7/2002 | Nishitani .......... | H01L 21/67115 219/411 |
| 7,015,422 B2 * | 3/2006 | Timans ................. | C23C 16/481 118/724 |

(Continued)

FOREIGN PATENT DOCUMENTS

| KR | 20020008045 A | 1/2002 |
|---|---|---|
| KR | 20040110947 A | 12/2004 |

(Continued)

*Primary Examiner* — Tu B Hoang
*Assistant Examiner* — Yeong Juen Thong
(74) *Attorney, Agent, or Firm* — Renaissance IP Law Group LLP

(57) ABSTRACT

The present disclosure relates to a substrate processing apparatus and a substrate processing method using the same, the substrate processing method including: introducing a substrate into a chamber; processing the substrate while heating the substrate by using a heat source unit provided in the chamber; and reciprocating at least any one of the substrate and the heat source unit in an extending direction of the substrate. Thus, while the substrate is processed, the temperature of the substrate may be uniformly adjusted, and the efficiency of thermal processing of the substrate may thereby be improved.

3 Claims, 6 Drawing Sheets

(56) References Cited

U.S. PATENT DOCUMENTS

| | | | |
|---|---|---|---|
| 7,151,239 B2* | 12/2006 | Takei | H01L 21/67109 |
| | | | 219/444.1 |
| 2003/0173348 A1* | 9/2003 | Backer | H05B 3/0076 |
| | | | 219/405 |
| 2007/0072346 A1* | 3/2007 | Maeda | H01L 21/67126 |
| | | | 438/124 |
| 2009/0200724 A1* | 8/2009 | Iguchi | B65H 37/04 |
| | | | 270/8 |
| 2010/0150634 A1* | 6/2010 | Yoshida | B65H 29/14 |
| | | | 399/405 |
| 2015/0136186 A1* | 5/2015 | Brown | H01L 21/67115 |
| | | | 134/113 |
| 2016/0262207 A1* | 9/2016 | Abe | H01L 21/67115 |
| 2016/0270994 A1* | 9/2016 | Staudinger | A61G 13/02 |

FOREIGN PATENT DOCUMENTS

| | | |
|---|---|---|
| KR | 100779158 B1 | 11/2007 |
| KR | 100795338 B1 | 1/2008 |
| KR | 20080043844 A | 5/2008 |
| KR | 20120107012 A | 9/2012 |
| KR | 20130098663 A | 9/2013 |
| KR | 20130135708 A | 12/2013 |
| KR | 101371707 B1 | 3/2014 |
| KR | 20140125205 A | 10/2014 |

* cited by examiner

METHOD AND APPARATUS FOR SUBSTRATE PROCESSING

CROSS-REFERENCE TO RELATED APPLICATION

This application claims priority to Korean Patent Application No. 10-2017-0047964 filed on Apr. 13, 2017 and all the benefits accruing therefrom under 35 U.S.C. § 119, the contents of which are incorporated by reference in their entirety.

BACKGROUND

The present disclosure relates to a substrate processing apparatus and a substrate processing method using the same, and more particularly, to a substrate processing apparatus and a substrate processing method which are capable of improving thermal processing efficiency for substrates.

Recently, a rapid thermal processing (RTP) method has been widely used as a thermal processing method for substrates or the like.

The RTP method is a method in which a substrate is irradiated with radiation light radiated from a heat source such as a tungsten lamp and is thereby heated and processed. Compared to existing substrate thermal processing methods, such an RTP method has merits in that a substrate can be rapidly heated or cooled, and a pressure condition or a temperature range can be easily adjusted and controlled, and thus, the quality of thermal processing for the substrate can be improved.

In order to uniformly heat a substrate, a method in which heat sources are optimally arranged, and the substrate is rotated is being used. However, as substrates become larger, the scale of the substrate processing apparatus also becomes larger, and the rotation of the substrate thereby becomes difficult. Thus, the substrate is heat-processed while being mounted on a substrate supporting frame.

Meanwhile, the RTP apparatus has heat source units which are disposed at regular intervals or in a pattern so that the substrate can be efficiently heated. However, there is a limitation in that, a temperature difference is caused in the heat source unit between the central portion of the heat sources and spaces between the heat sources, and this phenomenon is directly reflected to the substrate and a temperature deviation is caused for each position in the substrate.

SUMMARY

The present disclosure provides a substrate processing apparatus and a substrate processing method using the same which can improve the thermal processing efficiency for substrates.

In accordance with an exemplary embodiment, a substrate processing apparatus includes: a chamber providing an internal space for processing a substrate; a substrate support part provided inside the chamber so as to support the substrate; a heat source unit provided in the chamber parallel to the substrate so as to heat the substrate; and a drive part for moving at least any one of the substrate support part and the heat source unit, wherein at least any one of the substrate support part and the heat source unit is allowed to reciprocate in an extending direction of the substrate.

The internal space may include: a first internal space configured to accommodate the substrate support part; and a second internal space configured to accommodate the heat source unit, wherein the first internal space and the second internal space may be separated from each other.

The substrate support part may include: a substrate support configured to support the substrate; and a first rolling member provided so as to contact a bottom surface of the substrate support.

The heat source unit may include: a heat source; a support body configured to support the heat source; and a second rolling member provided to contact at least a portion of the support body.

The heat source may include: a first heat source emitting a first wavelength; and a second heat source emitting a second wavelength different from the first wavelength, wherein the first and second heat sources may be alternately disposed.

The chamber may include: a gas injection port provided to supply a process gas into the first internal space; and a gas discharge port provided to face the gas injection port and configured to discharge a gas inside the first internal space, wherein the gas injection port and the gas discharge port may be disposed so as to form a flow of the gas in a direction crossing a moving direction of the substrate support.

The drive part may include: a drive apparatus configured to provide power; and a drive member configured to move the support body and the substrate support in directions opposite to each other using the power supplied from the drive apparatus.

The drive member may include: a first rack plate connected to the support body; a second rack plate provided parallel to the first rack plate and connected to the substrate support; and a pinion provided between the first rack plate and the second rack plate so as to be engaged with the first rack plate and the second rack plate, and connected to the drive apparatus.

The substrate processing apparatus may include: a first connecting member provided between the substrate support and the first rack plate; and a second connecting member provided between the support body and the second rack plate, wherein the first connecting member and the second connecting member may be disposed to pass through a wall body of the chamber.

The heat source unit may include: an upper heat source unit provided above the substrate support part; and a lower heat source unit provide below the substrate support part.

The drive part may include: a drive apparatus configured to provide power; and a drive member configured to move the upper heat source unit and the lower heat source unit using the power provided from the drive apparatus.

The drive member may include: a first rack plate connected to the upper heat source unit; a second rack plate provided parallel to the first rack plate and connected to the lower heat source unit; and a pinion provided between the first rack plate and the second rack plate so as to be engaged with the first rack plate and the second rack plate, and connected to the drive apparatus.

In accordance with another exemplary embodiment, a substrate processing method includes: introducing a substrate into a chamber; processing the substrate while heating the substrate by using a heat source unit provided in the chamber; and reciprocating at least any one of the substrate and the heat source unit in an extending direction of the substrate.

The reciprocating at least any one of the substrate and the heat source unit may include moving the substrate or the heat source unit by using one drive part.

The reciprocating at least any one of the substrate and the heat source unit may include moving the substrate and the heat source unit in directions opposite to each other.

The heat source unit may include a plurality of heat sources disposed at a regular period, and the reciprocating at least any one of the substrate and the heat source unit may include moving the heat source unit and the substrate by a distance smaller than the period at which the heat sources are disposed.

The heat source unit may include a plurality of heat sources disposed at a regular period, and the reciprocating at least any one of the substrate and the heat source unit may include moving the heat source unit and the substrate by one half of the period.

The heat source unit may include an upper heat source unit provided above the substrate and a lower heat source unit provided below the substrate, and the reciprocating at least any one of the substrate and the heat source unit may include moving the heat source unit and the substrate in directions opposite to each other.

BRIEF DESCRIPTION OF THE DRAWINGS

Exemplary embodiments can be understood in more detail from the following description taken in conjunction with the accompanying drawings, in which.

Figure 4:
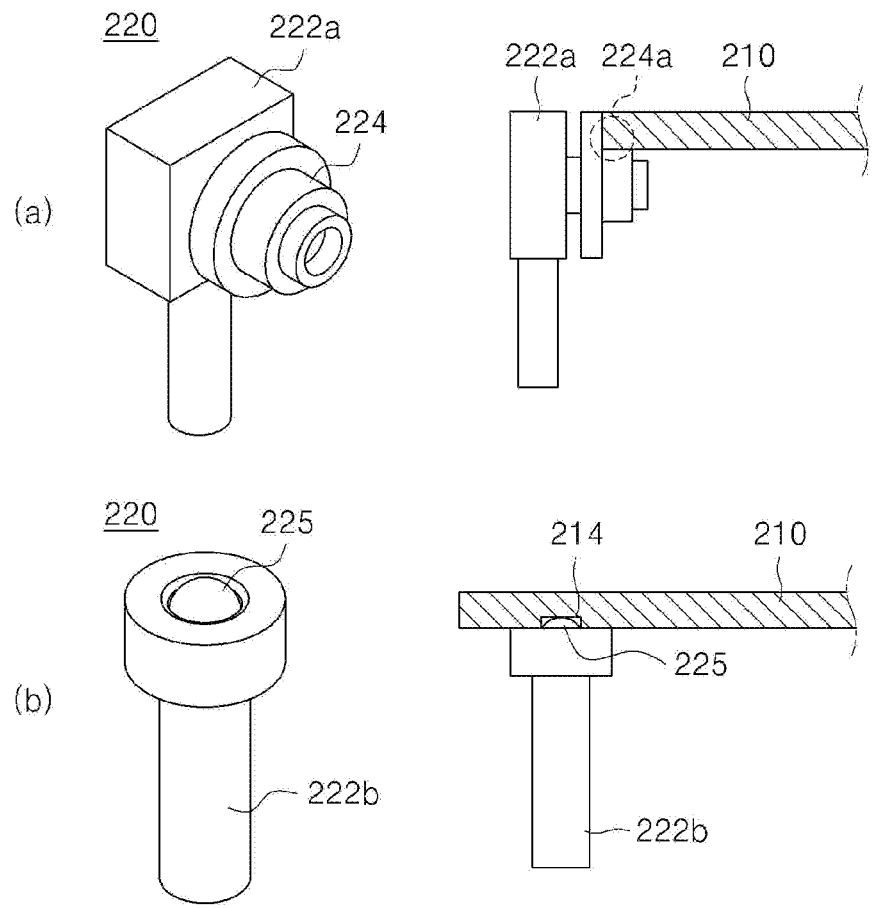
Figure 5:
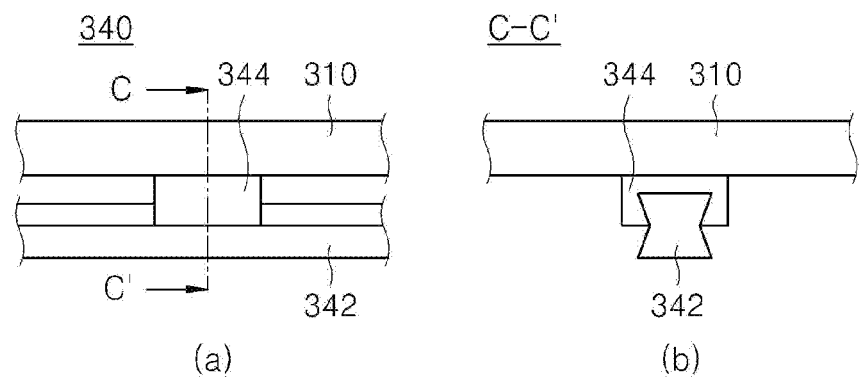
Figure 6:
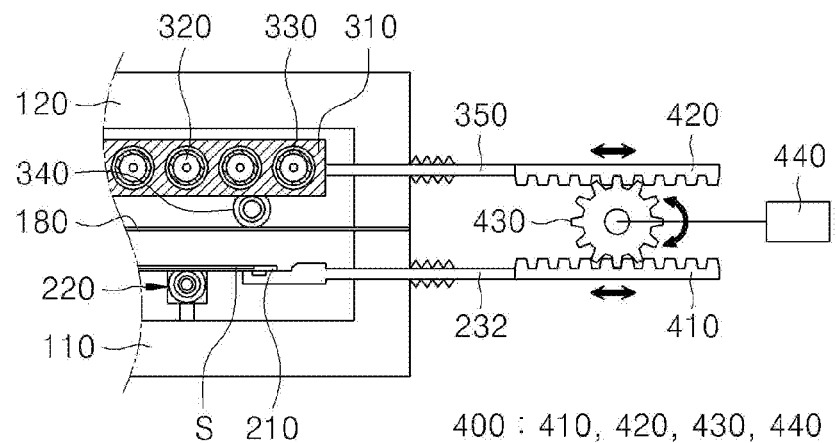
Figure 7:
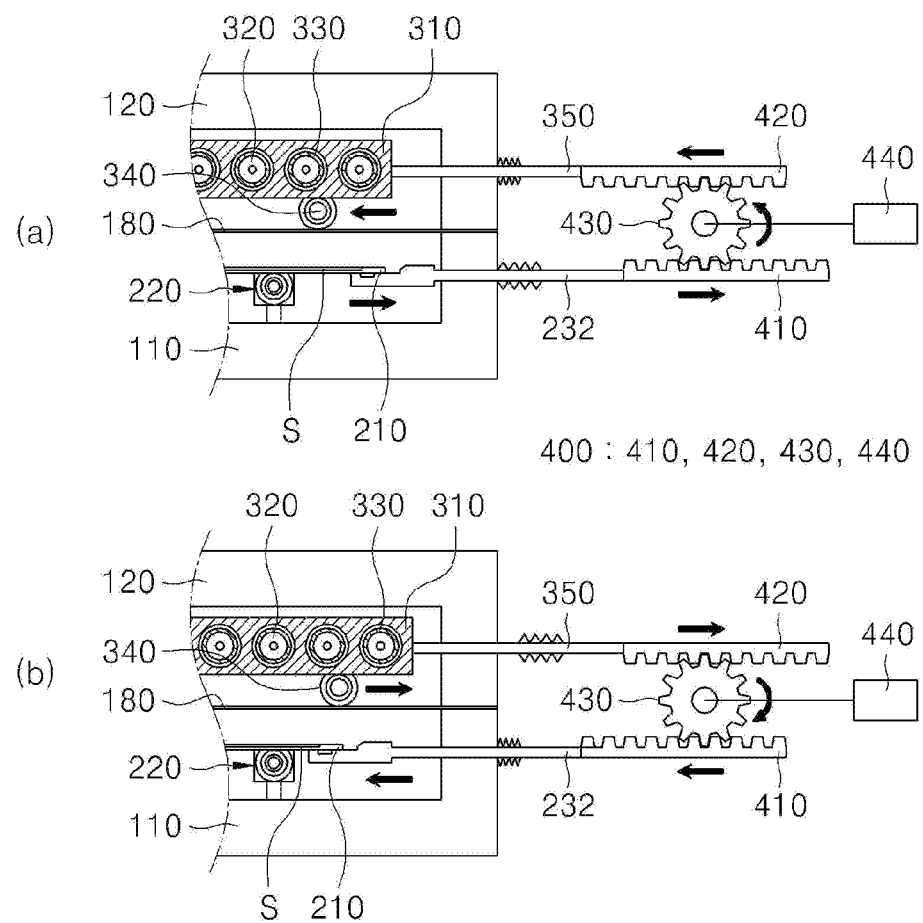
Figure 8:
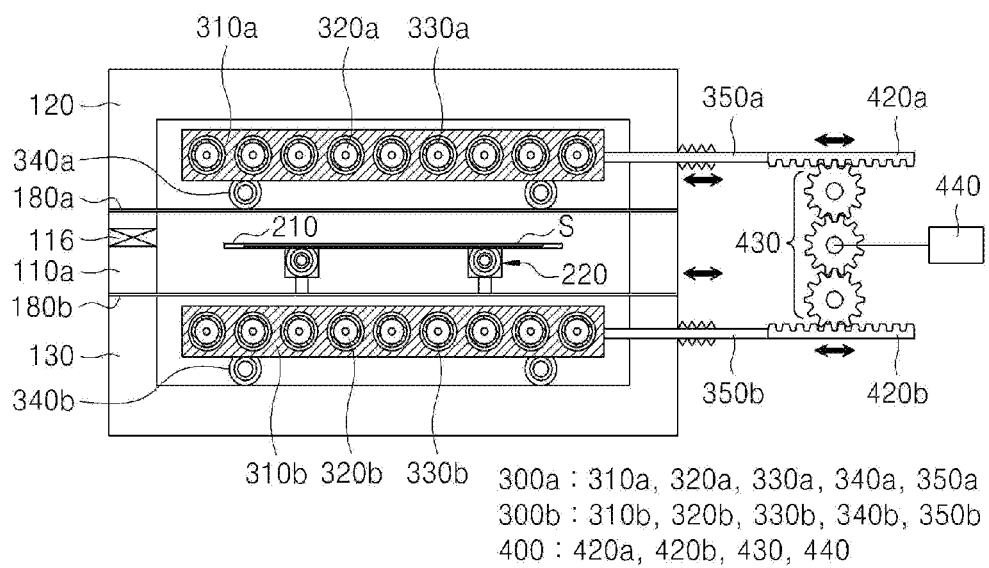
Figure 9:
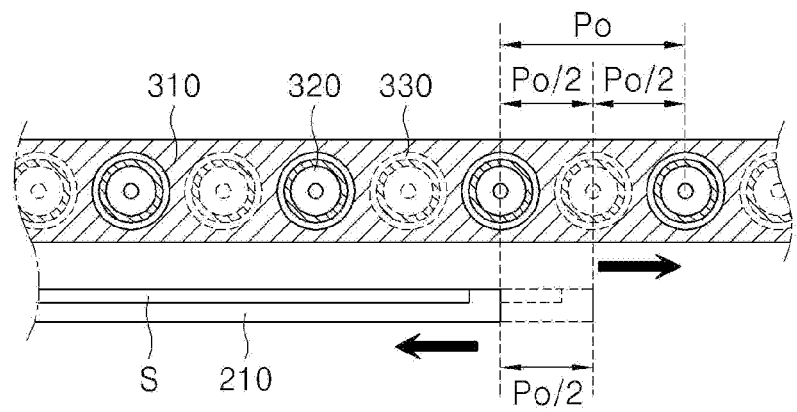
Figure 10:
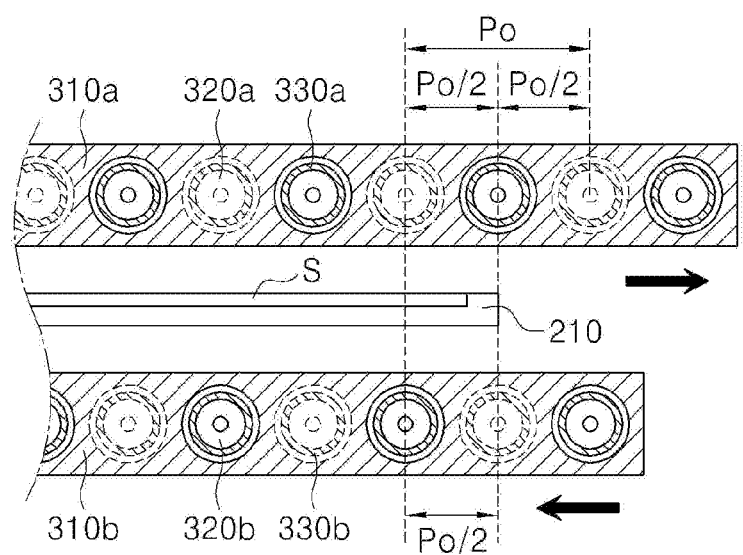

(a) and (b) of FIG. 4 are perspective views of first rolling member used in a substrate processing apparatus in accordance with a modified exemplary embodiment;

(a) and (b) of FIG. 5 are views illustrating a modified example of a second rolling member;

FIG. 6 is a view illustrating an example of a drive part used in a substrate processing apparatus in accordance with an exemplary embodiment;

(a) and (b) of FIG. 7 are views illustrating operating states of a drive part;

FIG. 8 is a cross-sectional view in accordance with a modified exemplary embodiment;

FIG. 9 is a view illustrating a state of processing a substrate using a substrate processing apparatus in accordance with an exemplary embodiment; and FIG. 10 is a view illustrating a state in which a substrate is processed by using a substrate processing apparatus in accordance with a modified exemplary embodiment.

DETAILED DESCRIPTION OF EMBODIMENTS

Hereinafter, specific embodiments will be described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the drawings, like reference numerals refer to like elements throughout.

Figure 1:
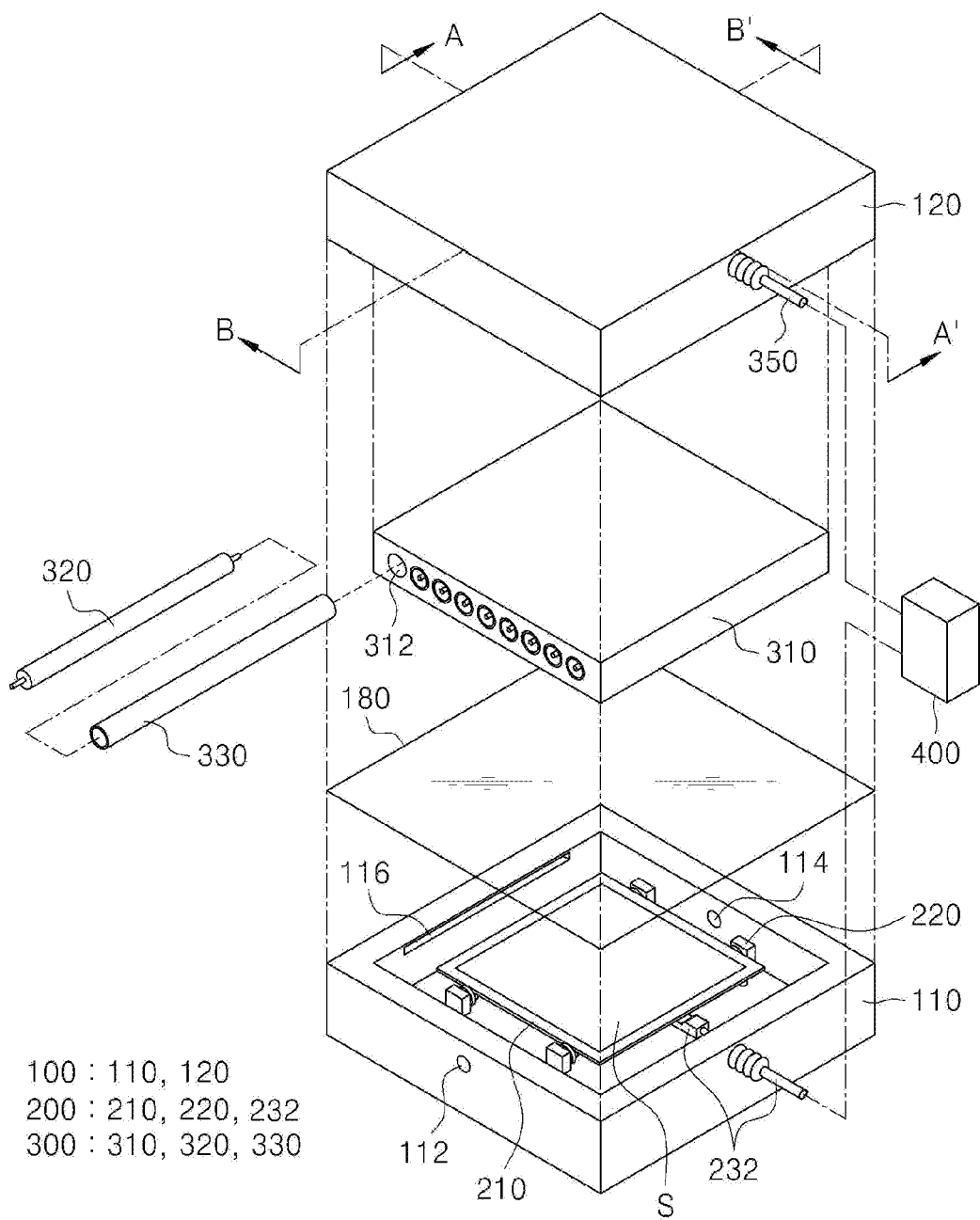
FIG. 1 is an exploded perspective view of a substrate processing apparatus in accordance with an exemplary embodiment.
Figure 2:
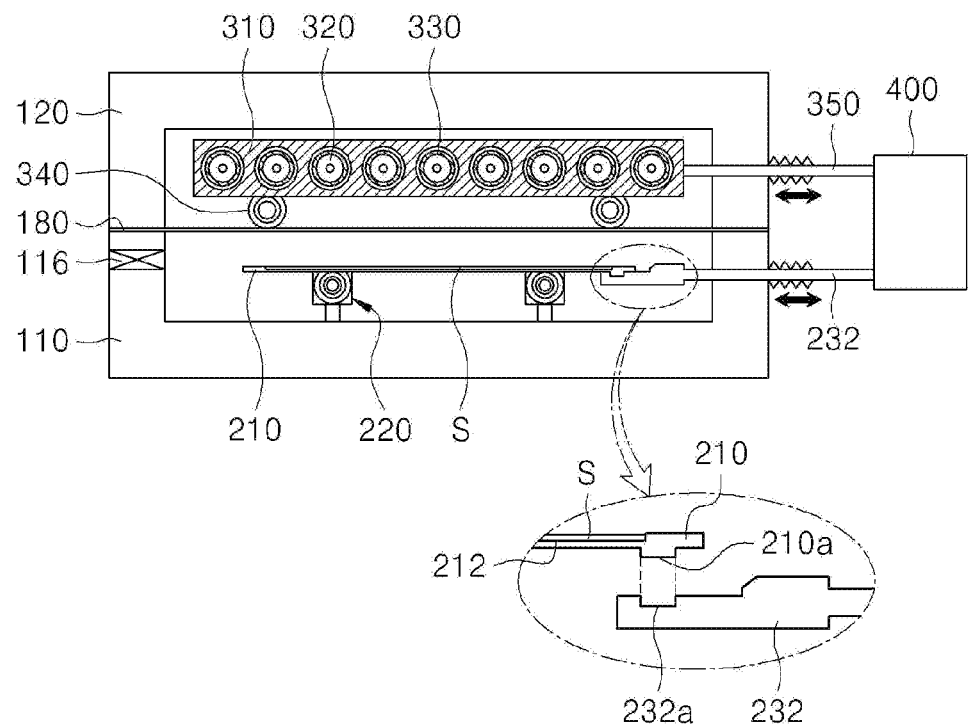
FIG. 2 is a cross-sectional view taken along line A-A' illustrated in FIG. 1.
Figure 3:
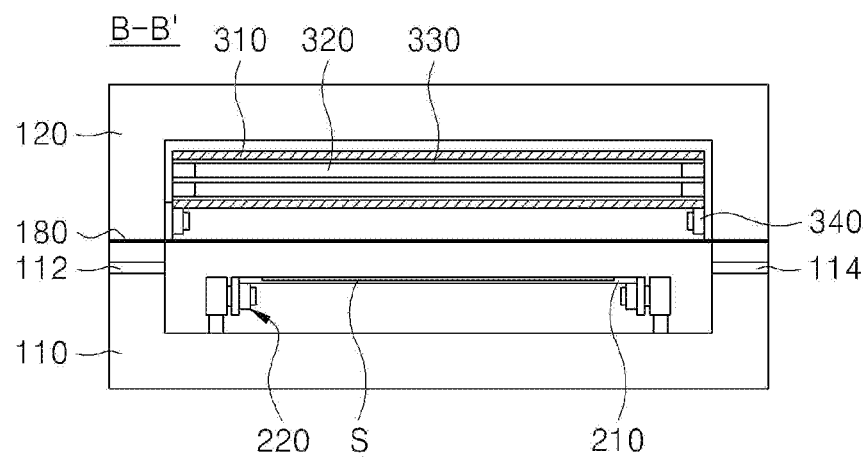
FIG. 3 is cross-sectional view taken along line B-B' illustrated in FIG. 1.

FIG. 1 is an exploded perspective view of a substrate processing apparatus in accordance with an exemplary embodiment, FIG. 2 is a cross-sectional view taken along line A-A' illustrated in FIG. 1, FIG. 3 is a cross-sectional view taken along line B-B' illustrated in FIG. 1, (a) and (b) of FIG. 4 are perspective views of first rolling member used in a substrate processing apparatus in accordance with a modified exemplary embodiment, (a) and (b) of FIG. 5 are views illustrating a modified example of a second rolling member, FIG. 6 is a view illustrating an example of a drive part used in a substrate processing apparatus in accordance with an exemplary embodiment, and (a) and (b) of FIG. 7 are views illustrating operating states of a drive part.

Referring to FIGS. 1 to 3, a substrate processing apparatus in accordance with an exemplary embodiment may include: a chamber 100 which provides an internal space in which a substrate S is processed; a substrate support part 200 including a substrate support 210 which supports the substrate S inside the chamber 100; a heat source unit which is provided in the chamber 100 parallel to the substrate support 210 so as to heat the substrate S; and a drive part 400 for moving the substrate support 210 and the heat source unit 300. At this point, the substrate support 210 and the heat source unit 300 may be provided to be reciprocatable inside the chamber 100 in the direction in which the substrate support 210 extends while the substrate S is processed.

Although the present exemplary embodiment describes an example in which the substrate S is horizontally disposed inside the chamber 100, and the heat source unit 300 is disposed in an upper portion of the chamber 100 so as to be parallel to the substrate S, that is, parallel to the substrate support 210, the heat source unit 300 may also be provided in each of the upper and lower portions of the substrate support 210. In addition, the chamber may be vertically disposed, and the substrate may also be vertically disposed in the direction in which the chamber is disposed. In this case, the heat source unit may also be disposed on one side surface or on both the side surfaces of the substrate support 210.

The chamber 100 is an element in which an internal space for receiving and heating the substrate S, that is, a vacuum heating space, is provided, and the approximate shape thereof may be, as illustrated in the drawings, formed in a hollow box shape or a block shape. In addition, the chamber 100 may be integrally manufactured in one body, but may also be an assembled body in which several components are connected or coupled. In this case, a sealing means (not shown) may further be provided on connection portions between each of the components. Accordingly, the energy input to the apparatus while the substrate S is heated or cooled may be saved.

For example, the chamber 100 may include: a hollow body 110 having an open upper portion; and a hollow upper lid 120 coupled to the upper portion of the body 110 and having an open lower portion. Here, the body 110 may be provided with a first internal space in which the substrate is processed, and the upper lid 120 may be provided with a second internal space which can accommodate the heat source unit 300. At this point, the first and second internal spaces may be separated from each other by a transparent window 180, and for example, the transparent window 180 may be connected to the upper portion of the body 110 or to the lower portion of the upper lid 120. The transparent window 180 may be manufactured by using quartz, sapphire, etc, which can transmit radiation light radiating from the heat source.

In addition, a gate 116 may be formed in a side wall of the body 110 for loading and unloading the substrate S. In addition, in the body 110, a gas injection port 112 for supplying a process gas into the first internal space and a gas discharge port 114 for discharging a gas in the first internal space may be formed. At this point, the gas injection port 112 and the gas discharge port 114 may be formed to face each other and be formed in the direction crossing the gate 116.

In order to effectively discharge the gas inside the chamber 100 through the gas discharge port 114, a pump may be mounted on an exhaust line (not shown) connected to the gas discharge port 114. Through such a configuration, pressure control such as the formation of vacuum inside the chamber 100 may also be performed.

A liner (not shown) may be formed in an inner wall of the body 110. The liner is formed in all places which the process gas can reach inside the body 110 and adsorb contaminants generated during the process. As such, by applying the liner in the inner wall of the lower body 110, a period for maintenance and repair may be extended by replacing only the liner without cleaning the entire apparatus. At this point, the liner may be formed of at least any one of graphite or graphite coated with silicon carbide (SiC), silicon carbide, silicon nitride, alumina ($Al_2O_3$), aluminum nitride, and quartz.

The upper lid 120 may be coupled to the upper portion of the body 110, and the second internal space which can accommodate the heat source unit 300 therein may be formed in the upper lid 120. At this point, the open lower portion of the upper lid 120 may be coupled to the upper portion of the body 110 and may separate, as independent spaces, the first internal space formed in the body 110 with the transparent window 180 interposed between the upper lid 120 and the body 110, and the second internal space formed in the upper lid 120.

The substrate support part 200 may be provided in the body 110. The substrate support part 200 may include: a substrate support 210 provided inside the body 110, that is, in the internal space; a first rolling member 220 provided to be able to contact a bottom surface of the substrate support 210 inside the body 110; and a first connecting member 232 for connecting the substrate support 210 to the drive part 400.

The substrate support 210 may be formed in a plate shape having an area so as to mount the substrate S thereon, and be formed so as to have a greater area than the substrate S. At this point, the substrate S may be formed in a thin-sheet or plate shape extending in one direction, for example, in the lengthwise direction, and formed in various shapes, such as a polygon or a circle.

In addition, a mounting groove 212 on which the substrate S can be mounted may be formed in an upper surface of the substrate support 210. In addition, the substrate support 210 may also be formed so that only one substrate can be mounted and also be formed so that a plurality of substrates can be mounted. In the latter case, the mounting grooves of the number corresponding to the number of substrates may be formed in the upper surface of the substrate support so that a plurality of substrates can be mounted.

The substrate support 210 may be formed of at least any one of graphite having excellent heat conductivity or graphite coated with silicon carbide (SiC), silicon carbide, silicon nitride, alumina ($Al_2O_3$), aluminum nitride, and quartz.

The first connecting member 232 may connect the drive part 400 and the substrate support 210. Accordingly, the first connecting member 232 is disposed to pass through the body 110 such that a portion thereof may be disposed inside the body 110 and a portion thereof may be disposed outside the body 110. The first connecting member 232 is not fully connected to the substrate support 210, but may be connected so as to contact a portion of the substrate support 210.

Referring to FIG. 2, a protruding section 210a may be formed on the bottom surface of the substrate frame 210, and a recess section 232a may be formed on one side of the first connecting member 232. The coupling method of the substrate support 210 and the first connecting member 232 are not limited thereto but may be variously modified.

The first connecting member 232 may be connected to the drive part 400 to move the substrate support 210 using the power supplied from the drive part 400. The first connecting member 232 may be movably connected on a wall body of the body 110, and in this case, heat, process gas, or the like may be discharged between the first connecting member 232 and the body 110. Accordingly, a bellows or the like may be installed to the connection portion of the first connecting member 232 and the body 110 and seal the inside of the body 110 while allowing the first connecting member 232 to move.

Through such a configuration, the substrate support 210 may be moved by the first driving means 230 in the extending direction of the substrate support 210, for example, the lengthwise direction of the substrate support 210 or the lengthwise direction of the substrate S. At this point, the first rolling member 220, which movably supports the substrate support 210 so that the substrate support 210, may smoothly moved may be provided in the body 110.

Referring to (a) of FIG. 4, the first rolling member 220 may be formed in a roller type. The first rolling member 220 may include: a support 222a fixedly installed to the body 110; and a roller 224 rotatably connected to the support 222a. At this point, the first rolling member 220 may be disposed in a direction crossing the direction in which the substrate support 210 moves and support bottom surfaces on both edges of the substrate support 210. In this case, the roller 224 may have a step 224a which may contact bottom and side surfaces of the substrate support 210 so as to guide the movement of the substrate support 210, that is, to prevent the substrate support 210 from deviating while moving.

Referring to (b) of FIG. 4, the first rolling member 220 may be formed in a ball type. The first rolling member 220 may include: a support 222a fixedly installed to the body 110; and a ball 225 rotatably connected to the support 222a. At this point, the ball 225 may be provided so as to contact the bottom surfaces on both edges of the substrate support 210. In this case, since the ball 225 may rotate in all directions, the substrate support 210 may deviate from a path while moving. Accordingly, a guide groove 214 may be formed in the bottom surface of the substrate support 210, that is, at a position contacting the ball 225, in the moving direction of the substrate support 210, for example, in the lengthwise direction of the substrate support 210. In this case, since a portion of the ball 225 may move the substrate support 210 while being inserted into the guide groove 214, the substrate support 210 may be prevented from deviating from the moving path.

In addition, the first rolling member 220 may be formed in various shapes which can linearly move the substrate support 210.

The heat source unit 300 may be provided inside the upper lid 120 so as to be disposed parallel to the substrate support 210. The heat source unit 300 may include heat sources 320 and a support body 310 which supports the heat sources 320, and a second connection member 350 for connecting a second rolling member 340 and a support body 310.

The support body 310 may be formed in a hollow shape which has an open lower portion and in which a space that can accommodate heat sources 320 is formed. For example, the support body 310 may be formed in a hexahedral shape having an open lower portion. Insertion grooves 312 into which the heat sources 320 are inserted are formed in the support body 310, and the heat sources 320 may be inserted into and fixed to the insertion grooves 312 of the support body 310 while being inserted into separate light transmitting tubes 330. At this point, the support body 310 may be formed to have wider area than the substrate support 210, and a plurality of heat sources 320 may be disposed to be spaced apart from each other over the entirety of the support body 310. Accordingly, the heat source unit 300 may heat the entirety of the substrate.

As the heat sources 320, at least any one of a tungsten halogen lamp, a carbon lamp, and a ruby lamp may be used, and a linear shape extending in one direction may be used. As illustrated in the drawings, a plurality of heat sources 320 may also be disposed to be spaced apart from each other and parallel to each other, and also be disposed to have a lattice-shaped array so as to heat the entirety of the substrate. In addition, the same kind of heat sources 320 may be disposed so that the heat sources 320 emit near-infrared wavelengths of approximately 800 nm to approximately 1400 nm or mid-range infrared wavelengths of approximately 1400 nm to approximately 3000 nm. Alternatively, at least two or more kinds of heat sources 320 which may emit wavelengths within ranges different from each other may be used. For example, the heat sources 320 may include a first heat source emitting a first wavelength and a second heat source emitting a second wavelength different from that of first heat source, and the first and second heat sources may be alternately disposed.

The heat source unit 300 may be disposed so as to be movable inside the upper lid 120, that is, in the second internal space.

The heat source unit 300 may be moved in the extending direction of the substrate support 210 or the extending direction of the substrate S. In addition, the heat source unit 300 and the substrate support 210 may be moved in directions opposite to each other. At this point, the heat source unit 300 may move within a range overlapping the substrate so as to heat the entirety of the substrate during substrate processing.

The heat source unit 300 may not be fixedly installed inside the upper lid 120, but may be mounted on upper portions of second rolling members 340 so as to be movable inside the upper lid 120. The second rolling members 340 may be configured as a roller type or a ball type like first rolling members 220. At this point, the second rolling members 340 may be connected to an inner side wall of the upper lid 120 through a support so as to support bottom surfaces of both edges of the support body 310. The second rolling members 340 have nearly the same basic structure except for having a different connection structure, for example, the connecting direction, to the upper lid 120.

When the second rolling members 340 are formed in a roller type, the rollers may be provided with a step so that the rollers may contact the heat source unit 300, more specifically, a side wall and a bottom surface of the support body 310.

Alternatively, when the second rolling members 340 are formed in a ball type, the balls may be provided so that the balls may contact the bottom surface of the support body 310 of the heat source unit 300. At this point, a guide groove may be formed in the moving direction of the heat source unit 300 in the bottom surface of the support body 310 contacting the balls, and the heat source unit 300 may be moved while at least portions of the balls are inserted in the guide groove.

In addition, the second rolling member 340 may be formed in various shapes which can linearly move the support body 310. Referring to (a) and (b) of FIG. 5, a second rolling member 340 may include: a guide bar 342 disposed in the moving direction of a support body 310 inside an upper lid 120; and a fastening member 344 connected to the bottom surface of the support body 310 and engaged with the guide bar 342 so as to be movable in the longitudinal direction of the guide bar 342. At this point, the support body 310 may be fixed to the fastening member 344 or detachably connected to the fastening member 344.

A second connecting member 350 may pass through the upper lid 120 and connect the support body 310 and the drive part 400. Accordingly, a portion of the second connecting member 350 may be disposed inside the upper lid 110 and a portion of second connecting member 350 may be disposed outside the upper lid 110. The second connecting member 350 may move the support body 310 using the power supplied from the drive part 400. Accordingly, the second connecting member 350 may move while passing through the upper lid 120. At this point, since the insides of the upper lid 120 and a body 110 are separated by a transparent window 180, it is not necessary to seal a connection portion between the second connecting member 350 and the upper lid 120. However, if necessary, the connection portion between the second connecting member 350 and the upper lid 120 may be sealed by using a sealing member such as a bellows.

The drive part 400 may include: a drive apparatus 440 which provides power that can move the substrate support 210 and the support body 310; and a drive member which can drive the substrate support 210 and the support body 310 using the power supplied from the drive apparatus 440. At this point, the drive member may linearly move the substrate support 210 and the support body 310 using the power supplied from the drive apparatus 440. In addition, the drive member may move the substrate support 210 and the support body 310 in directions opposite to each other.

A motor or the like which provides torque may be used as the drive apparatus 440. The drive member may convert the rotary motion provided from the drive apparatus 440 into a linear motion. The drive member may be implemented in various forms which can linearly move the substrate support 210 and the support body 310, and in the present embodiment, a rack plate and a pinion which could convert the rotary motion provided from the drive apparatus 440 into a linear motion were used as the drive member.

Referring to FIG. 6, a drive member may include: a first rack plate 410 connected to a substrate support 210; a second rack plate 420 disposed parallel to the first rack plate 410 and connected to a support body 310; and a pinion 430 provided between the first rack plate 420 and the second rack plate 420 so as to be engaged with the first rack plate 420 and the second rack plate 420. At this point, teeth may be formed in one surface of the first rack plate 410, for example, in the lower surface, and teeth may be formed in one surface of the second rack plate 420 facing the one surface of the first rack plate 410, for example, in the upper surface. In addition, in the outer circumferential surface of the pinion 430, teeth which can be engaged with the teeth formed in the lower surface of the first rack plate 410 and the teeth formed in the upper surface of the second rack plate 420. Accordingly, the pinion 430 may be engaged with the first rack plate 410 and the second rack plate 420 and thereby rotated by the torque supplied from a drive apparatus 440.

When the pinion is rotated by the torque supplied from the drive apparatus 440, the first rack plate 410 and the second rack plate 420 are moved in directions opposite to each other. At this point, the substrate support 210 connected to the first rack plate 410 through the first connecting member 232 and the support body 310 connected to the second rack plate 420 through the second connecting member 350 may also be moved in directions opposite to each other. In order that the substrate support 210 and the support body 310 may be moved while the first rack plate 410 and the second rack plate 420 move, the chamber 100 and the pinion 430 should be maintained at a state of being fixed to a specific position. The drive apparatus 440 may alternately rotate the pinion 430 in one direction or the other direction, other than continuously rotating the pinion 430 in one direction, so as to reciprocate the substrate support 210 and the support body 310 in one direction. That is, as illustrated in (a) of FIG. 7, when the pinion 430 is rotated to the left, the first rack plate 410 moves to the left, and the second rack plate 420 moves to the right. In addition, as illustrated in (b) of FIG. 7, when the pinion 430 is rotated to the right, the first rack plate 410 moves to the right, and the second rack plate 420 moves to the left. Through such a method, the substrate support 210 and the support body 310 may be moved to reciprocate by changing the rotating direction of the pinion 430.

Here, the first rack plate 410 is described to be connected to the substrate support 210 through the first connecting member 232. However, the first rack plate 410 may also be directly connected to the substrate support 210. In addition, the first rack plate 420 is described to be connected to the support body 310 through the second connecting member 350. However, the second rack plate 420 may also be directly connected to the support body 310.

While a substrate is processed through such a configuration, the temperature may uniformly be adjusted over the entirety of the substrate S by moving the substrate support 210 on which the substrate is mounted and the support body 310 in which heat sources 320 are installed. At this point, the substrate support 210 and the heat source unit 300 may move within a range in which the entirety of the substrate may be heated. That is, during substrate processing, the substrate may overlap the heat source unit 320 so that the entirety of the substrate may be heated by radiation light emitted from the heat sources 320.

Hereinafter, a modified exemplary embodiment will be described.

FIG. 8 is a cross-sectional view of a substrate processing apparatus in accordance with a modified exemplary embodiment.

Referring to FIG. 8, a substrate processing apparatus in accordance with a modified exemplary embodiment may include: a chamber 100 which provides an internal space in which a substrate S is processed; a substrate support part 200 including a substrate support 210 which supports the substrate S inside the chamber 100; a heat source unit which is provided, in the chamber 100, parallel to the substrate support 210 so as to heat the substrate S; and a drive part 400 for moving the heat source unit. At this point, the heat source unit may be provided above and below the substrate support part 200 and provided in the extending direction of the substrate support 210 so as to be able to reciprocate inside the chamber 100 while the substrate S is processed.

The substrate processing apparatus in accordance with a modified exemplary embodiment may be may be formed in a nearly similar form as that of the substrate processing apparatus described in the aforementioned embodiment except for being configured to move the heat source units provided above and below the substrate support 210 while the substrate is processed. Accordingly, features different from the aforementioned substrate processing apparatus will be selectively described.

The chamber 100 may include: a hollow body 110a having open upper and lower portions; a hollow upper lid 120 connected to an upper portion of the body 110a and having an open lower portion; and a hollow lower body 130 having an open upper portion. Here, the body 110a may be provided with a first internal space, in which the substrate is processed, and second internal spaces in which the upper lid 120 and the heat source unit can be accommodated, respectively. At this point, the first and second internal spaces may be separated from each other by transparent windows 180a and 180b. For example, the transparent windows 180a and 180b may be provided between the body 110a and the upper lid 120 and between the body 110a and the lower body 130 and thereby may separate the first internal surface and the second internal spaces.

The substrate support part 200 may be provided in the body 110a. The substrate support part 200 may include: a substrate support 210 provided inside the body 110a, that is, in the first internal space so as to support the substrate S; and first rolling members 220 provided to be able to contact the bottom surface of the substrate support 210 inside the body 110a. At this point, the substrate support part 200 may move to load and unload the substrate S and does not move while the substrate S is processed. The first rolling members 220 for moving the substrate support 210 when the substrate S is loaded or unloaded may support the substrate support 210 so that the substrate support 210 may move when the substrate support 210 is moved by using a transport apparatus (not shown) provided outside the chamber 100.

The heat source unit may include: an upper heat source unit 300a provided in the upper lid 120; and a lower heat source unit 300b provided in the lower body 130.

The upper heat source unit 300a and the lower heat source unit 300b may be formed in the nearly the same shape as the aforementioned heat source unit 300.

The upper heat source unit 300a may include: an upper support body 310a; upper heat sources 320a; upper light-transmitting tubes 330a having the upper heat sources 320a inserted therein and fixedly installed in the upper support body 310a; upper rolling members 340a which movably support the upper support body 310a in the upper body 120; and an upper connecting member 350a.

The lower heat source unit 300b may include: a lower support body 310b; lower heat sources 320b; lower light-transmitting tubes 330b having the lower heat sources 320b inserted therein and fixedly installed in the lower support body 310b; and lower rolling members 340b which movably support the upper support body 310b in the lower body 130; and a lower connecting member 350b.

In the upper heat source unit 300a and the lower heat source unit 300b, the upper heat sources 320a and the lower heat sources 320b may be disposed at positions corresponding to each other. That is, the upper heat source units 300a and the lower heat source units 300b may be disposed to be symmetrical to each other by disposing the lower heat sources 320b under the positions at which the upper heat sources 320a have been disposed.

Alternatively, in the upper heat source unit 300a and the lower heat source unit 300b, the upper heat sources 320a and the lower heat sources 320b may also be disposed so as to be offset from each other. That is, the lower heat sources 320b may be disposed at positions corresponding to spaces between the plurality of upper heat sources 320a when the plurality of upper heat sources 320a are disposed.

The upper rolling members 340a and the lower rolling members 340b may be formed in the same structure except that the directions of supporting the upper support body 310a and the lower support body 310b are different.

The upper connecting member 350a may pass through the upper body 120 and connect the upper support body 310a to the drive part 400, and the lower connecting member 350b may pass through the lower body 130 and connect the lower support body 310b to the drive part 400.

The drive part 400 may include: a drive apparatus 440 which provides power that can move the upper support body 310a and the lower support body 310b; and a drive member which can drive the upper support body 310a and the lower support body 310b using the power supplied from the drive apparatus 440. At this point, the drive member may linearly move the upper support body 310a and the lower support body 310b using the power supplied from the drive apparatus 440. In addition, the drive member may move the upper support body 310a and the lower support body 310b in directions opposite to each other.

A motor or the like which provides torque may be used as the drive apparatus 440. The drive member may convert the rotary motion provided from the drive apparatus 440 into a linear motion. The drive member may be implemented in various forms which can linearly move the upper support body 310a and the lower support body 310b, and in the present modified embodiment, a rack plate and pinions which could convert the rotary motion provided from the drive apparatus 440 into a linear motion were used as the drive member.

The drive member may include: a first rack plate 420a connected to the upper support body 310a; a second rack plate 420b disposed parallel to the first rack plate 420a and connected to the lower support body 310b; and pinions 430 provided between the first rack plate 420a and the second rack plate 420b so as to be engaged with the first rack plate 420a and the second rack plate 420b. At this point, teeth may be formed in one surface of the first rack plate 420a, for example, in the lower surface, and teeth may be formed in one surface of the second rack plate 420b facing the one surface of the first rack plate 420a, for example, in the upper surface. In addition, in the outer circumferential surfaces of the pinions 430, teeth may be formed, which can be engaged with the teeth formed in the lower surface of the first rack plate 420a and the teeth formed in the upper surface of the second rack plate 420b. A plurality of pinions 430 may be provided according to the distance between the first rack plate 420a and the second rack plate 420b, and an odd number of pinions 430 may be provided so that the first rack plate 420a and the second rack plate 420b may move in directions opposite to each other. Accordingly, the pinions 430 may be engaged with the first rack plate 420a and the second rack plate 420b and thereby rotated by the torque supplied from the drive apparatus 440. When the pinions rotate, the first rack plate 420a and the second rack plate 420b move in directions opposite to each other, and the upper support body 310a connected to the first rack plate 420a through the upper connecting member 350a and the lower support body 310b connected to the second rack plate 420b may also move in directions opposite to each other through the lower connecting member 350b. At this point, in order that the upper support body 310a and the lower support body 310b may be moved while the first rack plate 420a and the second rack plate 420b move, the chamber 100 and the pinion 430 should be maintained at a state of being fixed to a specific position.

Here, the first rack plate 420a is described to be connected to the upper support body 310a through the upper connecting member 350a. However, the first rack plate 420a may also be directly connected to the upper support body 310a. In addition, the second rack plate 420b is described to be connected to the lower support body 310b through the second connecting member 350b. However, the second rack plate 420b may also be directly connected to the lower support body 310b.

While the substrate is processed through such a configuration, the temperature may uniformly be adjusted over the entirety of the substrate S by moving the upper support body 310a and the lower support body 310b in directions opposite to each other while the substrate support 210 on which the substrate is mounted is fixed.

Hereinafter a substrate processing method in accordance with an exemplary embodiment will be described.

FIG. 9 is a view illustrating a state in which a substrate is processed by using a substrate processing apparatus in accordance with an exemplary embodiment, and FIG. 10 is a view illustrating a state in which a substrate is processed by using a substrate processing apparatus in accordance with a modified exemplary embodiment.

First, a substrate S is introduced into a chamber 100 and mounted on a substrate support 210. At this point, the introduction of the substrate S may also be performed by using a separate transporting means (not shown), or the substrate support 210 is unloaded to the outside of the chamber 100, and then the substrate S may also be introduced into the chamber 100 after being mounted on the substrate support 210. As the substrate S, at least any one of nickel (Ni), copper (Cu), cobalt (Co), molybdenum (Mo), magnesium (Mg), platinum (Pt), silver (Ag), chromium (Cr), manganese (Mn), titanium (Ti), and tungsten (W) may be used, and may also be formed in a plate shape or a thin-sheet shape extending in one direction.

When the substrate S is mounted on the substrate support 210, the gas in an internal space of the chamber 100, that is, the gas in a first internal space is discharged to make the pressure inside the first internal space into a vacuum state.

Subsequently, the temperature in the first internal space is raised by applying power to the heat source unit 300, and graphene is deposited on the substrate S while a process gas is supplied through a gas injection port 112. At this point, the substrate support 210 may be heated to approximately 800° C. to approximately 1050° C., and a carbon-containing gas, such as $CH_4$, $C_2H_6$, $C_2H_2$, and $C_6H_6$ may be used as the process gas. While graphene is deposited on the substrate S, the process gas is supplied through the gas injection port 112 and unreacted gas, remainders, and the like are discharged through a gas discharge port 114.

In the step in which graphene is deposited on the substrate S, radiation light emitted from heat sources 320 passes through light-transmitting tubes 330 and a transparent window 180 and then irradiates the substrate S. Accordingly, the temperature of the substrate S is raised, and graphene may be uniformly deposited.

As such, while graphene is deposited, the substrate support 210 and the heat source unit 300 may be moved. Since a plurality of heat sources 320 are provided to be spaced apart from each other, temperature differences occur between direct lower portions of the heat source 320 and direct lower portions in spaces between the heat sources 320. This phenomenon is directly reflected to the substrate S, and the temperature differences are caused for each position on the substrate S according to the presence of the heat sources 320 in a portion directly above the substrate S. Accordingly, the temperature differences occurring for each position on the substrate S may be compensated by moving the substrate S and the heat source unit 300 or moving the heat source unit 300. That is, the temperature differences in the substrate may be compensated in a portion directly below the heat sources 320 and a portion directly below the space between the heat sources 320.

First, the method for moving the substrate support 210 and the heat source unit 300 will be described.

The movement of the substrate support 210 or the movement of the substrate support 210 and the heat source unit 300 may also be performed from the start to the completion of the substrate processing, or also selectively be performed during the substrate processing. In the latter case, when the temperature of the substrate is measured at a plurality of positions and the measured temperature falls out of a predetermined range, or when the plurality of measured temperatures exhibit differences from each other, the substrate support 210 and the heat source unit 300 may be moved and thus, the temperature differences for each position on the substrate S may be compensated.

The moving distance of the substrate support 210 and the heat source unit 300 may be determined according to a spatial period of the heat source unit. As described above, the heat source unit 300 may be configured from one kind of heat sources 320 emitting the wavelengths which are all within the same range, or also be configured from two kinds of heat sources 320 which emit wavelengths with different ranges from each other. At this point, when the heat source unit 300 is configured from one kind of heat sources 320, the period of the heat sources 320 may mean the distance Po from the center of a heat source 320 to the center of a neighboring heat source 320. In addition, when the heat source unit 300 is configured from two kinds of heat sources 320, for example, a first heat source and a second heat source, the first and second heat sources may be alternately disposed, and the period of the heat sources may mean the distance from the center of the first heat source to the center of the second heat source.

Referring to FIG. 9, when the substrate support 210 and the heat source unit 300 are simultaneously moved during the substrate processing, the substrate support 210 and the heat source unit 300 may be moved in directions opposite to each other. At this point, the substrate support 210 and the heat source unit 300 may move a distance shorter than the period Po of the heat sources 320.

More preferably, the substrate support 210 and the heat source unit 300 may be moved by one half of the period Po of the heat sources. As such, when the substrate support 210 and the heat source unit 300 are simultaneously moved while the substrate S is processed, there is an effect in that the moving distances of the substrate support 210 and the heat source unit 300 may be reduced.

That is, since the substrate support 210 and the heat source unit 300 are simultaneously moved in the directions opposite to each other, the same effect as that in the case, in which only the substrate support 210 is moved, may be exhibited even when the substrate support 210 and the heat source unit 300 are moved only by the half of that when only the substrate support 210 is moved, that is, the half of the period Po at which the heat sources 320 are arranged. At this point, the substrate support 210 and the heat source unit 300 may be moved within a range in which the substrate and the heat source unit 300 overlap each other.

The substrate 210 and the heat source unit 300 may be moved at speeds of approximately 20 mm/sec to 30 mm/sec. At this point, when the moving speed of the substrate support 210 is slower or faster than the proposed range, since it is difficult to efficiently control the temperature of the substrate, the substrate support 210 and the heat source unit 300 are preferably moved within the proposed range.

Next, the method for moving a heat source unit while a substrate S is processed will be described.

Referring to FIG. 10, while a substrate S is processed, an upper heat source unit 300a and a lower heat source unit 300b may be moved, and the upper heat source unit 300a and the lower heat source unit 300b may be moved in directions opposite to each other. At this point, the upper heat source unit 300a and the lower heat source unit 300b may move a shorter distance than the period Po of the upper heat sources 320a and the lower heat sources 320b. More preferably, the upper heat source unit 300a and the lower heat source unit 300b may be moved by the half of the period Po of the upper heat sources 320a and the lower heat sources 320b. As such, when the upper heat source unit 300a and the lower heat source unit 300b are simultaneously moved while the substrate S is processed, there is an effect in that the moving distance of the upper heat source unit 300a and the lower heat source unit 300b may be reduced.

That is, since the upper heat source unit 300a and the lower heat source unit 300b simultaneously move in directions opposite to each other, even when the upper heat source unit 300a and the lower heat source unit 300b move a shorter distance than that in case of moving only the upper heat source unit 300a or the lower heat source unit 300b, there is an effect in that the temperature of the substrate S may be uniformly adjusted.

Meanwhile, when the substrate processing is completed, the supply of the process gas is stopped, and the substrate may be cooled by supplying a cooling gas into the chamber 100. At this point, the cooling gas may be supplied independently to each of the first internal space and the second internal surface, and the same kind of cooling gases may be supplied, or the different kinds of cooling gases may also be supplied. While the substrate is cooled, the movements of the substrate support 210 and the heat source unit 300 or the movements of the upper heat source unit 300a and the lower heat source unit 300b may be stopped or be performed, if necessary. While the substrate is cooled, and when the substrate support 210 and the heat source unit 300 are made to reciprocate, or the upper heat source unit 300a and the lower heat source unit 300b are moved, the temperature differences for each position of the substrate may be compensated according to the same principle as that in case of processing the substrate, and thus, the substrate may be uniformly cooled.

Subsequently, when the substrate is cooled by a certain degree, the substrate is discharged through a gate 116.

As described above, in the substrate processing method in accordance with exemplary embodiments, the substrate support, or the substrate support and the heat source unit are moved while a substrate is processed, and the temperature differences occurring at each position on the substrate is thereby compensated, so that the substrate processing efficiency may be improved by uniformly heating the substrate, and accordingly, the productivity may also be improved.

In accordance with a substrate processing apparatus and a substrate processing method of exemplary embodiments, while the substrate is processed, the temperature of a substrate can be uniformly adjusted. That is, the substrate may be uniformly heated by simultaneously moving the substrate and a heat source or moving the heat source. In addition, when being moved, the substrate and the heat source are moved to reciprocate in the directions opposite to each other, and thus, the moving distance of the substrate and the heat source can be reduced.

Accordingly, since the moving distance can be reduced compared to the case in which only the substrate or the heat source is moved, an excessive increase in the size of a chamber can be prevented. In addition, when only the heat sources are moved during the substrate processing, the substrates can be moved in directions opposite to each other in the upper and lower side of the substrate.

Although the substrate processing apparatus and the substrate processing method have been described with reference to the specific embodiments, they are not limited thereto, but limited by claims below. Therefore, it will be readily understood by those skilled in the art that various modifications and changes can be made thereto without departing from the spirit and scope of the present invention defined by the appended claims.

What is claimed is:

1. A substrate processing apparatus comprising:
   a chamber configured to provide an internal space for processing a substrate;
   a transparent window installed in the chamber to divide the internal space into a first internal space and a second internal space;
   a substrate support installed in the first internal space to support the substrate;
   a first rolling member that is installed and fixed in the first internal space to support the substrate support in a movable manner;
   a heat source configured to heat the substrate and a support body configured to support the heat source so that the heat source is disposed parallel to the substrate support and installed in the second internal space;
   a second rolling member that is installed and fixed in the second internal space to support the support body in a movable manner;
   a motor configured to provide a power for moving the substrate support and the support body in an extension direction of the substrate and installed outside the chamber; and
   a drive member configured to connect the substrate support and the support body to the motor in order to move the substrate support and the support body by using the power provided from the motor,
   wherein the drive member comprises:
   a first rack plate connected to the substrate support;
   a second rack plate provided parallel to the first rack plate and connected to the support body; and
   a pinion connected to the motor and provided between the first rack plate and the second rack plate so as to be engaged with the first rack plate and the second rack plate;
   a first connecting member provided between the substrate support and the first rack plate; and
   a second connecting member provided between the support body and the second rack plate,
   wherein the first connecting member and the second connecting member are disposed to pass through a wall body of the chamber.

2. The substrate processing apparatus of claim 1, wherein the heat source comprises:
   a first heat source emitting a first wavelength; and
   a second heat source emitting a second wavelength different from the first wavelength,
   wherein the first and second heat sources are alternately disposed.

3. The substrate processing apparatus of claim 1, wherein the chamber comprises:
   a gas injection port provided to supply a process gas into the first internal space; and
   a gas discharge port provided to face the gas injection port and configured to discharge a gas inside the first internal space,
   wherein the gas injection port and the gas discharge port are disposed so as to form a flow of the gas in a direction crossing a moving direction of the substrate support.

* * * * *